United States Patent
Jung et al.

(10) Patent No.: US 7,821,006 B2
(45) Date of Patent: Oct. 26, 2010

(54) LIQUID CRYSTAL DISPLAY COMPRISING LIGHT SENSING TFT HAVING OPENING IN GATE ELECTRODE

(75) Inventors: Kwan-Wook Jung, Suwon-si (KR); Ung-Sik Kim, Suwon-si (KR); Pil-Mo Choi, Seoul (KR); Seock-Cheon Song, Suwon-si (KR); Ho-Suk Maeng, Seoul (KR); Sang-Hoon Lee, Seoul (KR); Keun-Woo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 280 days.

(21) Appl. No.: 11/486,606

(22) Filed: Jul. 14, 2006

(65) Prior Publication Data

US 2007/0013823 A1   Jan. 18, 2007

(30) Foreign Application Priority Data

Jul. 14, 2005   (KR) .................. 10-2005-0063870

(51) Int. Cl.
*H01L 29/423* (2006.01)
*H01L 31/0224* (2006.01)
*H01L 31/10* (2006.01)
*H01L 27/32* (2006.01)

(52) U.S. Cl. .............. 257/66; 257/72; 257/E29.136; 257/E29.151; 257/E31.125

(58) Field of Classification Search .......... 257/E31.052, 257/E31.053, E31.054, E31.055, E31.057, 257/E31.073, E31.076, E31.079, E31.082, 257/E31.083, E31.085, E31.091, E31.093, 257/E31.097, E31.101, E31.102, E31.124, 257/E31.125, E29.151, 57, 59, 66, 72, E29.111, 257/E29.112, E29.126, E29.127, E29.128, 257/E29.134, E29.135, E29.136, E29.137
See application file for complete search history.

(56) References Cited

U.S. PATENT DOCUMENTS

| 6,897,477 B2* | 5/2005 | Shibata et al. .............. 257/59 |
| 2005/0082968 A1* | 4/2005 | Choi et al. ................. 313/506 |

FOREIGN PATENT DOCUMENTS

| CN | 1402357 A | 3/2003 |
| CN | 1543636 | 11/2004 |
| EP | 1282173 A2 | 7/2002 |
| JP | 2003-229578 | 8/2003 |
| KR | 2002-0025979 | 4/2002 |
| KR | 10-2005-0036246 | 4/2005 |
| WO | WO 03/019271 | 3/2003 |

OTHER PUBLICATIONS

Patent Abstracts of Japan, Publication No. 2003-229578, Aug. 15, 2003, 2 pp.
English Language Abstract, Korean Patent Publication No. 2002-0025979, 1 p.
English Language Abstract, Korean Patent Publication No. 10-2005-0036246, Apr. 20, 2005, 1 p.

* cited by examiner

*Primary Examiner*—Lynne A Gurley
*Assistant Examiner*—Andrew O Arena
(74) *Attorney, Agent, or Firm*—Innovation Counsel LLP

(57) ABSTRACT

There are provided a TFT, a TFT substrate using the TFT, a method of fabricating the TFT substrate, and an LCD. The TFT includes a source region, a drain region, and a gate electrode having an opening. The opening of the gate electrode is to enhance the light sensing ability of the TFT when it is used as a light sensor, since light is incident into a region where the opening is formed. The TFT including the gate having the opening can be used in a substrate of a flat display or an LCD using such a substrate. The above TFT can sense light incident from outside the display to adjust the brightness of the screen according to the external illumination.

7 Claims, 6 Drawing Sheets

LIQUID CRYSTAL DISPLAY COMPRISING LIGHT SENSING TFT HAVING OPENING IN GATE ELECTRODE

CROSS REFERENCE TO RELATED APPLICATIONS

This application claims priority to Korean Patent application number 2005-63870, filed on Jul. 14, 2005, which is hereby incorporated by reference in its entirety.

BACKGROUND OF THE INVENTION

1. Field of the Invention

The present invention relates to a TFT and an LCD using the same, and more particularly, to a TFT usable as a light sensor, a TFT substrate using the TFT, a method of fabricating the TFT substrate and an LCD.

2. Description of the Related Art

In general, flat panel displays are one type of display having a slim profile and providing a flat picture. Flat panel displays include liquid crystal displays (LCDs), which are widely used as notebook computer monitors, organic electroluminescent devices (OELDs), which are widely used in cellular phones, etc. In such flat panel displays, thin film transistors (TFTs) are generally used as switching elements for independently operating the respective pixels.

FIG. 1A is a plane view of a thin film transistor according to a related art, and FIG. 1B is a sectional view taken along the line I-I' of FIG. 1A.

Referring to FIGS. 1A and 1B, the related art TFT includes a semiconductor layer 2 and a gate electrode 6 formed on a substrate 1. The semiconductor layer 2 is made of amorphous silicon or polycrystalline silicon (also referred to as polysilicon). A source region 3 and a drain region 4 are formed at selected portions of the semiconductor layer 2 such that the gate electrode 6 partially overlaps the source region 3 and the drain region 4. Between the semiconductor layer 2 and the gate electrode 6, a gate insulating film 5 is interposed. When an external voltage is applied to the gate electrode 6, a channel is formed in a channel region between the source region 3 and the drain region 4. Although not shown in the drawings, a metal electrode is formed on upper surfaces of the source region 3 and the drain region 4. By doing so, the TFT is electrically connected with an interconnection line for transmitting data or a pixel electrode disposed on each pixel region in an LCD to independently operate each pixel.

In a general flat panel display, a light sensor is used to sense the amount of light incident from an outside to adjust the brightness of a picture. A TFT can be used as such a light sensor. When light is incident into the light sensor TFT, light induced current is generated, even though the light sensor TFT is not turned on. The intensity of the light induced current is proportional to the amount of incident light. However, the related art TFT as shown in FIGS. 1A and 1B has the following drawback when it is used as a light sensor.

First, the TFT illustrated in FIGS. 1A and 1B has a reduced light-receiving area due to device structures positioned between the incident light and the source and drain regions. Again referring to FIG. 1A, light from an outside the TFT is incident on the source region 3 and the drain region 4, except for a portion of each shielded by the gate electrode 6. Additionally, since metal electrodes are formed on the source region 3 and the drain region 4, the light-receiving region of the light sensor TFT is substantially reduced. In addition to the above, the related art TFT has a drawback in that the light sensing capability is low, which will be described in more detail below.

In response to incident light, electron-hole pairs are generated in the source region 3 and the drain region 4. The generated pairs of electrons and holes move along the channel region, so that light induced current is generated. However, the electron-hole pairs generated in the source region 3 and the drain region 4 may not have a sufficient energy to pass through the channel region prior to recombination.

SUMMARY OF THE INVENTION

Accordingly, embodiments of the present invention provide a TFT having a superior light sensing ability.

Additionally, embodiments of the present invention provide a TFT substrate using the above TFT as a light sensor, and an LCD using the TFT substrate.

Embodiments of the present invention provide a TFT. The TFT includes a source region, a drain region and a gate electrode having an opening. When the TFT is used as a light sensor for sensing light, the light-receiving area increases in proportion to the area of the opening.

In some embodiments, the TFT includes; a source region and a drain region formed spaced apart from each other in a semiconductor layer; a gate insulating film covering the semiconductor layer; and a gate electrode formed on the gate insulating film and having at least one opening to expose a region between the source region and the drain region.

Also, the semiconductor layer may include a lightly doped region containing a first type of impurities at a concentration that is lower than impurity concentrations of the source region and of the drain region, the lightly doped region being adjacent to the source region and the drain region and partially overlapping the gate electrode. The lower concentration region suppresses leakage current from being generated, and also increases the light-receiving area when the TFT is used as a light sensor. The semiconductor layer may be formed of polysilicon, which has superior mobility characteristics for electrons or holes.

When the above TFT is employed in a substrate of a flat display, the TFT may be used as a light sensor, and the substrate is also provided with a separate TFT serving as a switching element. When assuming that the latter is a first TFT and the former is a second TFT, the first TFT is formed in a pixel region, while the second TFT is formed in a region other than the pixel region in the substrate. The pixel region is defined by a plurality of gate lines and data lines crossing each other.

When the second TFT is used as a light sensor, the first TFT and the second TFT can, advantageously, be formed at the same time. For example, in some embodiments, a semiconductor layer is formed on a substrate, and the substrate and the semiconductor layer are covered with a gate insulating film. A gate conductive film is formed on the gate insulating film, then the gate conductive film is patterned to form a plurality of gate electrodes. At least some of the gate electrodes have at least one opening. Impurity ions are implanted using the gate electrodes as masks to form a source region and a drain region. In some embodiments, the above method forms a first TFT including the gate electrode not having the opening and a second TFT including the gate electrode having the opening.

In some embodiments, the TFT substrate can be used in an LCD. The LCD may include a backlight for irradiating light, a display panel coupled with the backlight to display an image, and a chassis enclosing edges of the display panel. The display panel includes a substrate on which a second TFT having an opening is formed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
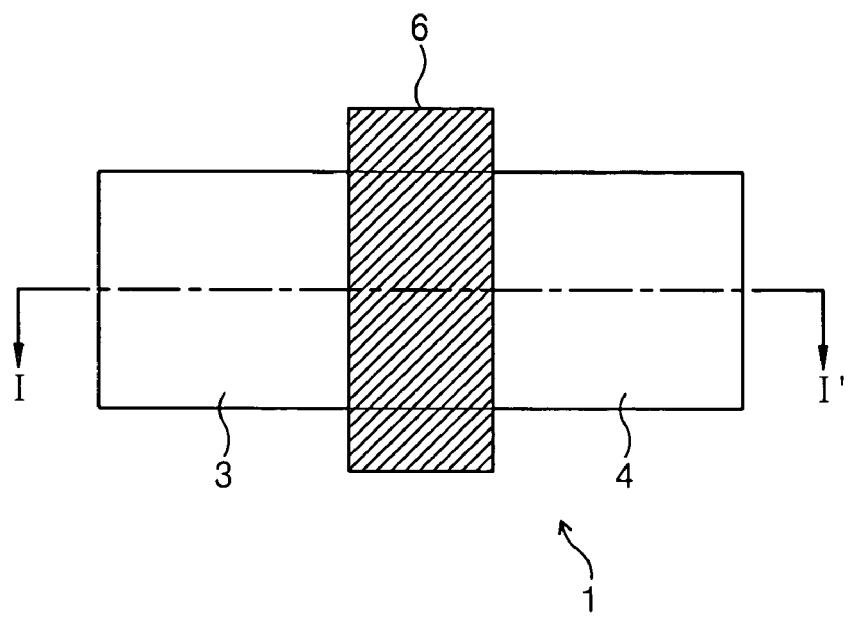
FIG. 1A is a plane view of a TFT according to a related art.

The present invention will now be described more fully with reference to the accompanying drawings, in which exemplary embodiments of the invention are shown. The invention may, however, be embodied in many different forms; rather, these embodiments are provided so that this disclosure will be thorough and complete, and will fully convey the concept of the invention to those skilled in the art. Accordingly, the invention should not be construed as being limited to the embodiments set forth herein. In the drawings, the thicknesses of layers and regions are simplified or exaggerated for clarity. Like reference numerals in the drawings denote like elements, and thus their description may be omitted.

Figure 2A:
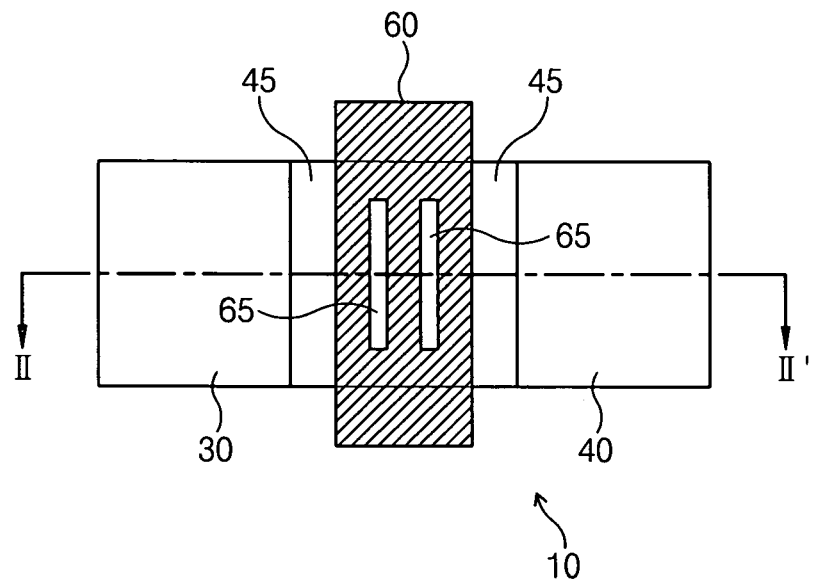
FIG. 2A is a plane view of a TFT according to an embodiment of the present invention.
Figure 2B:
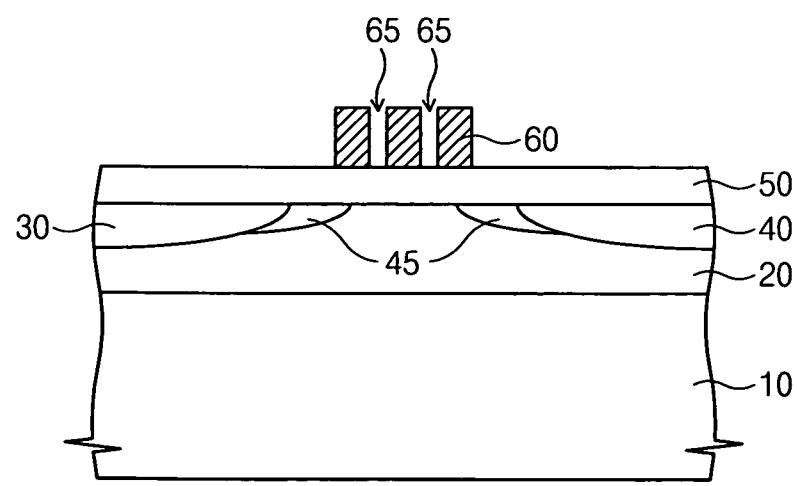
FIG. 2B is a sectional view taken along the line of II-II' of FIG. 2A.

FIG. 2A is a plane view of a TFT according to an embodiment of the present invention, and FIG. 2B is a sectional view taken along the line of II-II' of FIG. 2A.

Referring to FIG. 2A, a gate electrode 60 is formed in a selected direction, and a source region 30 and a drain region 40 are respectively formed on both sides of the gate electrode 60. An opening 65 is formed at selected portions of the gate electrode 60; in the embodiment shown in FIG. 2A, two rectangular openings 65 are formed. Lightly doped regions 45 (lightly doped with a relatively low concentration of one or more appropriate impurity materials) are also formed adjacent to the source region 30 and the drain region 40. Alternatively, the lightly doped regions may be added if necessary.

A vertical structure of the TFT will now be described. Referring to FIG. 2B, a semiconductor layer 20 and a gate insulating film 50 are stacked on a substrate 10, and a gate electrode 60 having openings 65 is disposed on a selected portion of the gate insulating film 50. The gate electrode 60 partially overlaps the lightly doped regions 45 of the semiconductor layer 20, and the openings 65 are formed so that light may be transmitted through openings 65 (shown as extending through the entire thickness of the gate electrode 60).

The above-described TFT structure has an important feature in that the gate electrode 60 is formed having the openings 65, which is particularly useful when the TFT is used as a light sensor to sense light. As noted above, a TFT may be used as a light sensor using light induced current generated by electron-hole pairs created by incident light. The light induced current depends on the amount of incident light received by the sensor. The performance of the light sensor depends on how much the light sensor can receive (the effective area of the sensor), as well as operation characteristics, such as the amount of light induced current generated in response to a very small amount of incident light. Both features are improved by the openings 65, which will be now described.

Figure 1B:
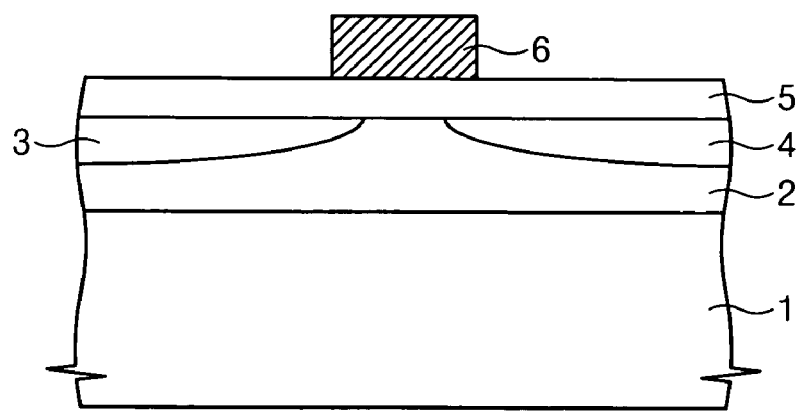
FIG. 1B is a sectional view taken along the line I-I' of FIG. 1.

In a TFT without openings 65, light irradiated onto the TFT would be shielded by the gate electrode 60 and would be incident on the source region 30 and the drain region 40. Also, although not shown in FIG. 2B, a metal electrode is formed on the source region 30 and the drain region 40. Accordingly, light would be incident on only a very small area of the source region 30 and the drain region 40 not covered by the metal electrodes. Thus, a prior art TFT such as that illustrated in FIGS. 1A and 1B has a substantially small light receiving area, but the TFT according to embodiments of the invention has a relatively large light receiving area, since light can be incident on the TFT through the openings 65 of the gate electrode 60.

In addition to enhancing the light-receiving ability of the TFT, openings 65 enable the TFT to sense a very small amount of light. Since the light sensor senses light by measuring the amount of light induced current, it is advantageous to have a greater light induced current per unit area for incident light having a particular intensity. For example, in the case of an n-type TFT, an energy level of electrons is higher in the channel region between the source region 30 and the drain region 40 than in the source region 30/drain region 40. Thus, although electrons are generated by light incident on the source region 30 and the drain region 40, they may annihilate prior to traversing the channel region.

Meanwhile, electrons or holes generated in the channel region having a relatively high energy level can move to the source region 30/drain region 40 relatively easily. As a result, the intensity of the light induced current may vary depending on the regions in which the light is incident. Light induced current is generated more efficiently when light is incident on the region between the source region 30 and the drain region 40. Since the openings 65 of the illustrated embodiment of the present invention are formed in the gate electrode 60 and allow light to be incident on the region between the source region 30 and the drain region 40, the TFT can generate detectable light induced current in response to (and thus sense) small amounts of light.

In the embodiment shown in FIGS. 2A and 2B, the openings 65 are formed at two positions, and are each formed in the shape of a rectangle. However, when openings 65 are configured to increase the light receiving area sufficiently, and/or when openings 65 increase generation of electrons and holes are generated in the region between the source region 30 and the drain region 40, the shape and number of the openings 65 may be varied. Accordingly, the openings 65 may be formed in the shape of a circle, a triangle, or other shape (not shown), and the number of the openings 65 may be a number equal to or greater than one. Additionally, each of the openings 65 need not be the same size, shape, etc.

As noted above, in some embodiments of the present invention, lightly doped regions 45 can be formed adjacent to the source region 30 and the drain region 40. These lightly doped regions 45 substantially reduce or prevent leakage current from being generated. Unlike the light induced current generated by an external factor such as incident light, leakage current may be generated by one or more internal characteristics of the TFT, such as the decrease of the channel length, the decrease of the threshold voltage, or the like. The light induced current serves as a signal for sensing an incident amount of light, while other current sources (such as the leakage current) are noise. The lightly doped regions 45 function to reduce or prevent such noise from being generated.

In addition, in some embodiments, the lightly doped regions 45 function to increase the light receiving area of the TFT. As shown in FIG. 2B, the lightly doped regions 45 partially overlap the gate electrode 60, but the remaining regions are not shielded by the gate electrode 60. Also, since the lightly doped regions 45 are not covered with a separate metal electrode, unlike the source region 30 or the drain region 40, external light can be irradiated into the lightly doped regions 45. In other words, the light induced current can be generated due to electron-hole pairs generated by the light incident on the lightly doped regions 45.

An apparatus employing the TFT having the above structure will now be described. TFTs may be used as elements for independently operating each pixel in a flat display, such as an LCD or an OELD. In addition, TFTs can be used as light sensors. Hereinafter, an embodiment of a TFT substrate constituting an LCD and using the TFTs such as the TFT illustrated in FIGS. 2A and 2B will be described.

Figure 3:
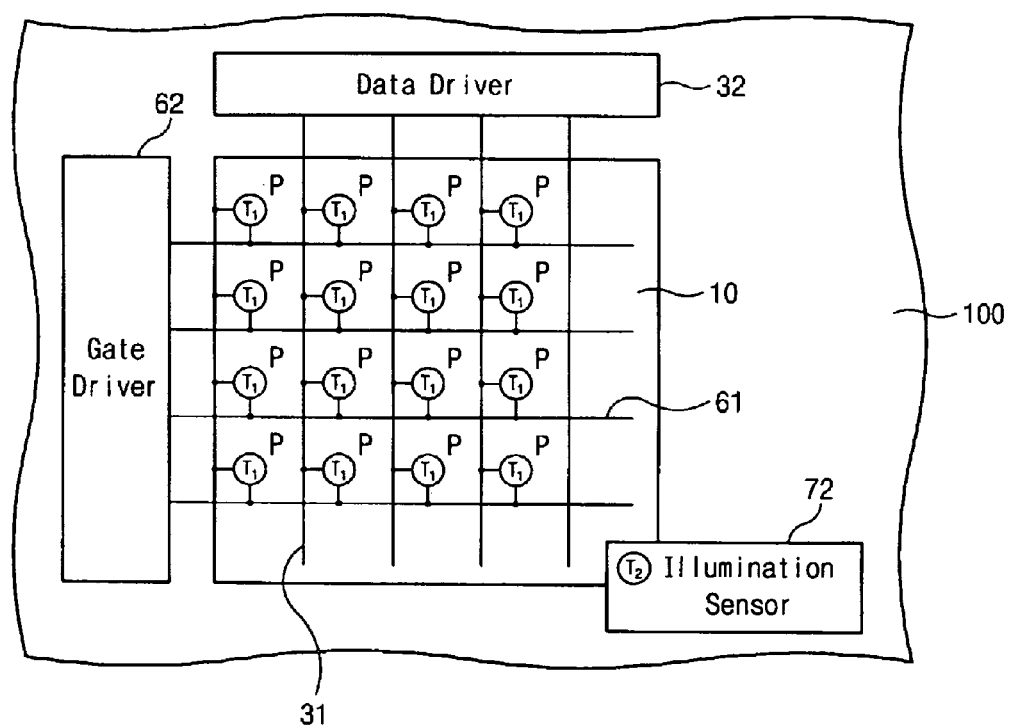
FIG. 3 is a plane view of a display panel employing a TFT according to the present invention.

FIG. 3 is a plane view of a display panel employing a TFT according to embodiments of the present invention.

An LCD is a display type that provides a viewer with an image by converting an input electrical signal into visible information by varying the light transmittance of the liquid crystal material. Liquid crystal is an intermediate state between liquid and crystal that has a light transmittance dependent on an applied voltage. The LCD includes a display panel 100 for displaying an image, and the display panel 100 includes a substrate 10 for displaying an image. Substrate 10 is divided into the units of pixels.

Referring to FIG. 3, the substrate 10 includes a plurality of gate lines 61 for transmitting gate-On signals, and a plurality of data lines 31 for transmitting data voltages to display the image signals. Individual pixels 'P' are defined where the plurality of gate lines 61 and the plurality of data lines 31 cross. Each pixel 'P' has a TFT 'T1' connected with an associated gate line 61 and an associated data line 31. The TFT 'T1' is turned on by the gate-On signal transmitted through the associated gate line 61. At this time, a data voltage transmitted to the data line 31 is applied to a pixel electrode (not shown) of the associated pixel 'P'. As the voltage is applied to the pixel electrode, the alignment direction of liquid crystal disposed proximate to the associated pixel on the substrate 10 is changed, so that the light transmittance of liquid crystal is also changed to display an image part.

Additionally, the display panel 100 also includes a gate driver 62, a data driver 32, and an illumination sensor 72. The data driver 32 functions to select a voltage corresponding to an image datum and transmit the selected voltage to the associated pixel. The gate driver 62 transmits On-Off signals for the TFT 'T1' such that data is transmitted from the data driver 32 to the associated pixel. The illumination sensor 72 senses the light incident from outside the display to adjust the brightness of the screen. In other words, the illumination sensor 72 senses whether the external environment is in a bright state or a dark state, and controls the illumination of a backlight generating light from the display backside to adjust the brightness of the screen.

The illumination sensor 72 is provided with one or more light sensors that can sense external light. A TFT 'T2' can be used as a light sensor. The TFT 'T2' used as the light sensor is a TFT having openings 65 formed in the gate electrode 60 as shown (for example) in FIGS. 2A and 2B. As described above, when TFT 'T2' has one or more openings 65, the light receiving amount increases and the light induced current also increases. As a result, TFT 'T2' can be advantageously used as a light sensor. In addition, when the TFT 'T2' is used solely as a light sensor, the technology related with the openings 65 can be extended to apply to an exemplary embodiment in which the gate electrode 60 is formed of a transparent conductive film. Alternately, the gate electrode 60 may be removed from the TFT 'T2', thereby increasing the incident area of light to the maximum degree.

In some embodiments of the present invention, the TFT 'T1' provided in the pixel 'P' is different in structure than the TFT 'T2' used as the light sensor. Accordingly, for discrimination between two TFTs, they are respectively named first TFT 'T1' and second TFT 'T2'.

Exemplary positions where the second TFT 'T2' may be formed will be described below.

The second TFT 'T2' generates a signal corresponding to a light induced current, which in turn is generated in response to received light. Herein, it is noted that light incident from outside the display should be sensed so as to adjust the brightness of the screen, and leakage current generated by factors other than the incident light is noise. Since an LCD is generally provided with a backlight disposed at a backside of the display panel 100 to generate light, the second TFT 'T2' should be disposed so as not to generate noise from the backlight. Since the light generated by the backlight is via the pixel 'P' defined by the gate lines 30 and the data lines 40, the second TFT 'T2' is disposed on a region on the substrate 10 outside the pixel regions.

Light can be sensed by a variety of sensors, such as photodiode-based sensors and the like. Among such a variety of sensors, using the TFT 'T2' as the light sensor as disclosed herein has an advantage that the TFT 'T2' can be formed at the same time TFT 'T1' (which serves as a switching element on the substrate 10) is formed, simplifying the manufacturing process for the display. Additionally, superior operational characteristics can be obtained by forming the openings 65 in the gate electrode 60. The first TFT 'T1' and the second TFT 'T2' can be formed at the same time by various methods. One of the various methods will now be described.

FIGS. 4A to 4E are sectional views illustrating a method of forming first and second TFTs on a substrate according to the present invention. In FIGS. 4A to 4E, region 'A' represents where a first TFT is formed and region 'B' represents where a second TFT is formed.

Figure 4A:
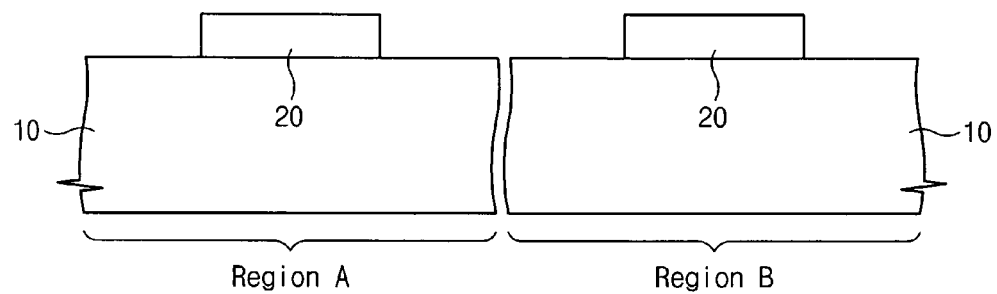
FIGS. 4A to 4E are sectional views illustrating a method of fabricating a TFT on a substrate according to the present invention.

Referring to FIG. 4A, a semiconductor layer 20 is formed on a substrate 10. The substrate 10 is generally a glass substrate, and the semiconductor layer 20 is generally formed of polysilicon. The semiconductor layer 20 may be formed of amorphous silicon, however, the polysilicon is more advantageous because polysilicon has a higher electron mobility than amorphous silicon. In the case of polysilicon, a silicon layer is formed on a glass substrate, is transformed into crystals by irradiating a laser beam onto the formed silicon layer, and the polycrystalline silicon layer is patterned to form the semiconductor layer 20.

Figure 4B:
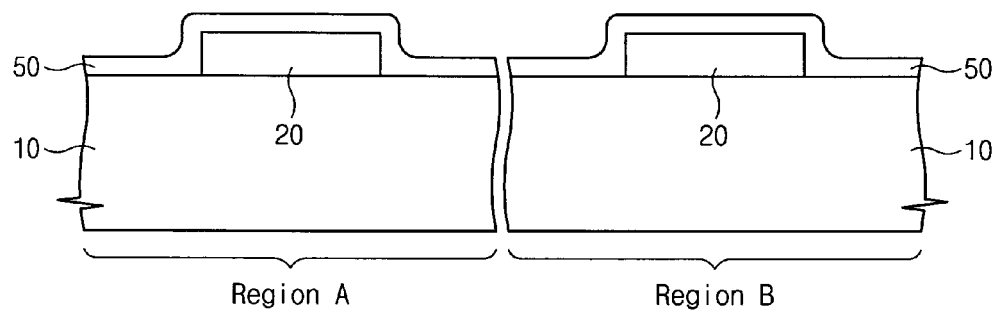

Referring to FIG. 4B, a gate insulating film 50 is formed on the semiconductor layer 20. The gate insulating film 50 can be formed by depositing silicon oxide (SiO) or silicon nitride (SiN) on the semiconductor layer 20 using a chemical vapor deposition (CVD) process.

Figure 4C:
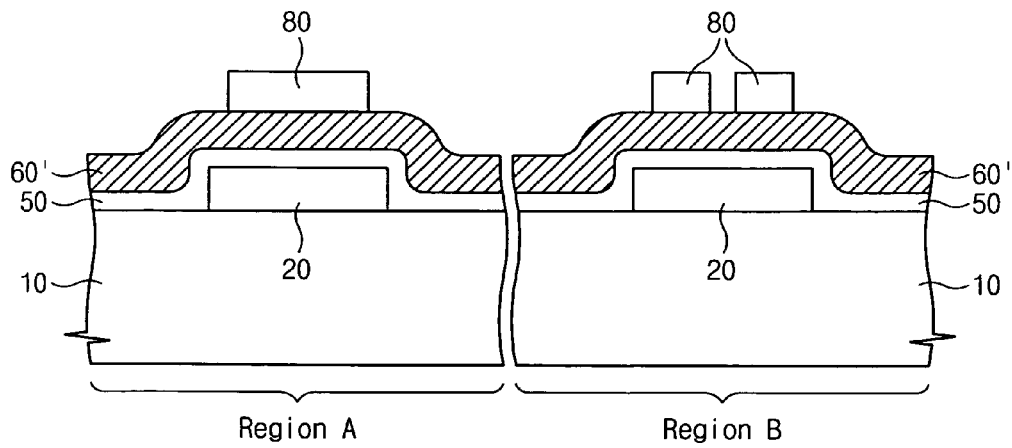

Referring to FIG. 4C, a gate conductive film 60' and a photoresist pattern 80 are formed on the gate insulating film

50. The gate conductive film 60' is formed by depositing a doped polysilicon or a metal film. Materials including metallic elements such as aluminum (Al) or tungsten (W) may be used for gate conductive film 60'. The photoresist pattern 80 is formed by coating a photoresist film on the gate conductive film 60' and patterning the coated photoresist film using a photolithography process such that the photoresist film is left only on predetermined regions. In the case of the second TFT 'T2', portions of the photoresist film corresponding to the openings 65 are removed, so that openings 65 may be patterned in the second TFT 'T2'.

Figure 4D:
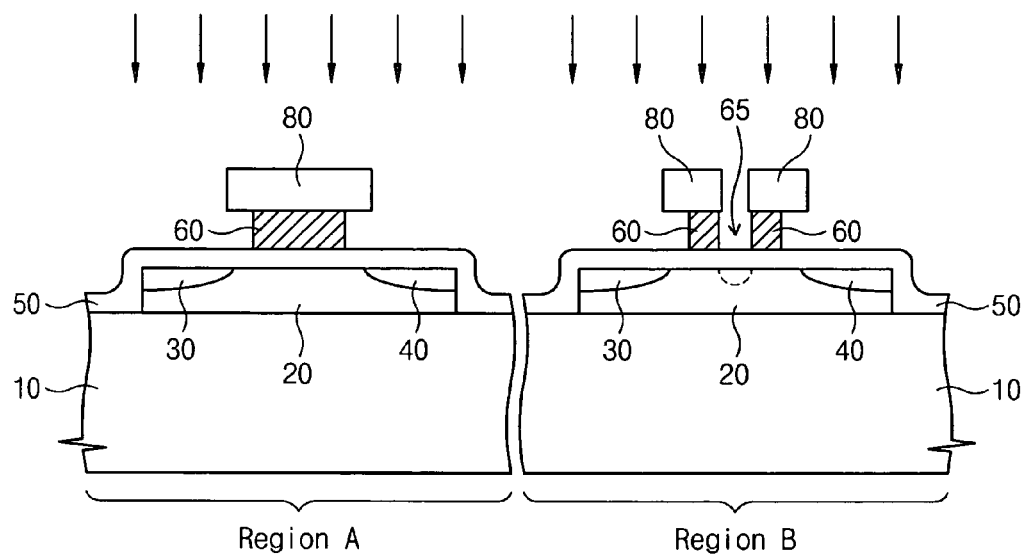

Referring to FIG. 4D, the gate conductive film 60' is etched using the photoresist pattern 60' as an etch mask to form a gate electrode 60. At this time, the openings 65 are formed in the second TFT 'T2'. In the present embodiment, a single opening 65 is formed, unlike the embodiment illustrated in FIG. 2B, illustrating that the number of the openings 65 is not particularly limited. As shown in FIG. 4D, the gate conductive film 60' is relatively overetched compared with the photoresist pattern 80, in order to form lightly doped regions 45, as described below. The lightly doped regions may be formed by a variety of methods, including methods other than the method provided in the present embodiment.

After the gate electrode 60 is formed, source region 30 and drain region 40 are formed by implanting impurity ions at a high concentration using the photoresist pattern 80 as a mask, as indicated by arrows in FIG. 4D. When the first and the second TFT 'T1, T2' are n-type TFTs, impurity ions such as phosphorous (P) or arsenic (As) ions are implanted. In the case of the second TFT 'T2', the impurity ions are implanted into the semiconductor layer 20 between the source region 30 and the drain region 40 (as indicated by a dotted line). During this implant, the regions proximate source region 30 and drain region 40 that may be processed to be lightly doped regions 45 are substantially shielded from the implant by photoresist pattern 80.

Figure 4E:
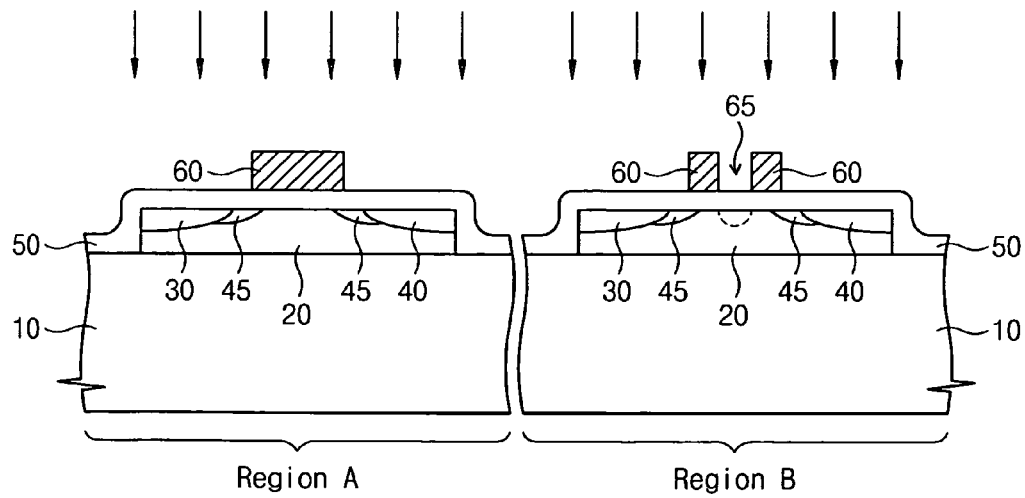

Referring to FIG. 4E, the photoresist pattern 80 on the gate electrode 60 is removed and impurity ions are implanted at a low concentration to form lightly doped regions 45. The photoresist pattern 80 is removed by an ashing method using oxygen plasma, or the like, and then impurity ions are implanted at a low concentration using the gate electrode 60 as a mask. As noted above, in the previous step of forming the gate electrode 60, the width of the gate electrode 60 is formed to be narrower than that of the photoresist pattern 80. Accordingly, portions of the semiconductor layer 20 corresponding to the width difference are shielded during the first implant but exposed during the second implant. As a result, regions 45 are doped with only the low concentration impurity ions. The low concentration impurity ions are also implanted into the source region 30 and the drain region 40, so that the doping concentration of the source region 30 and the drain region 40 is increased. During this implant, the impurity ions are also implanted even into the region where the opening 65 is formed (as indicated by a dotted line). In order to prevent the impurity ions to from being implanted into the region where the opening 65 is formed, a separate mask for the second TFT 'T2' may be used.

Thereafter, a general process is performed, which generally includes covering the gate electrode 60 with an interlayer insulating layer and forming a metal electrode perforating selected portions of the interlayer insulating layer to electrically contact the source region 30 and the drain region 40.

Next, an LCD simultaneously using the first TFT operating each pixel and the second TFT serving as the light sensor will be described.

Figure 5:
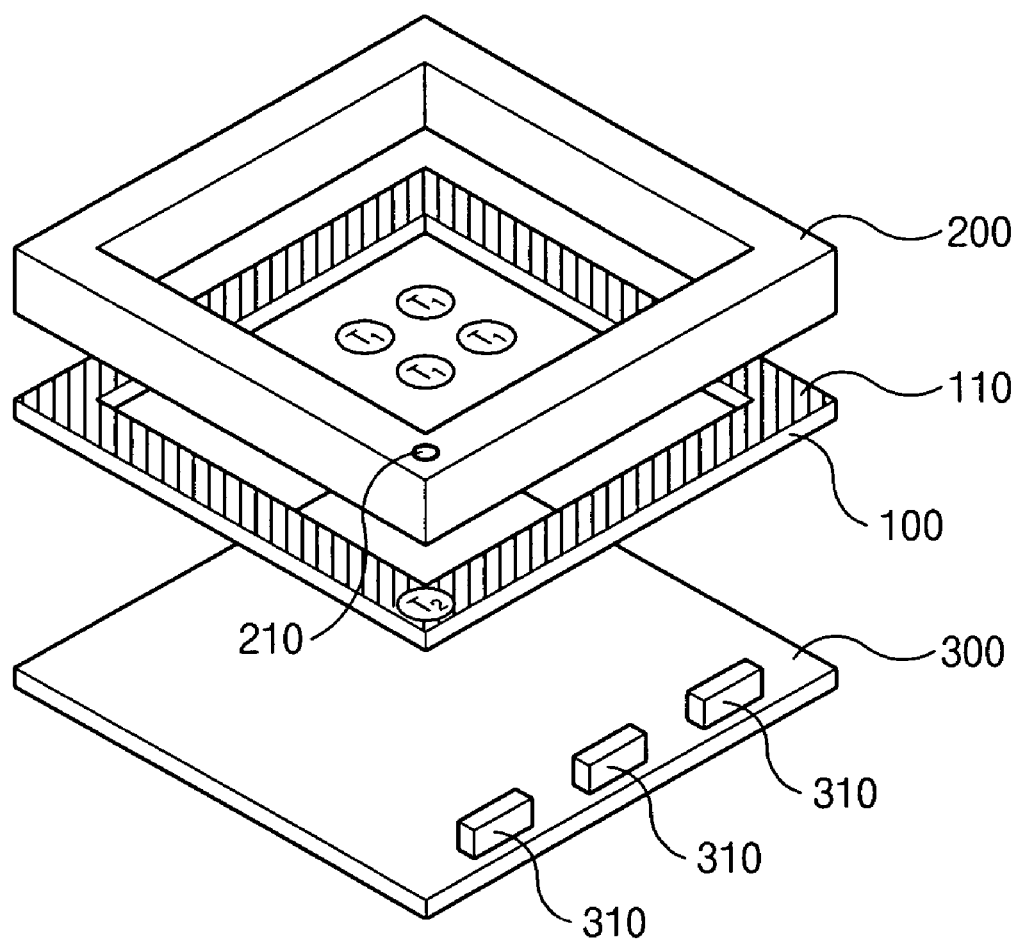
FIG. 5 is an exploded perspective view of an LCD according to an embodiment of the present invention.

FIG. 5 is an exploded perspective view of an LCD according to an embodiment of the present invention.

Referring to FIG. 5, embodiments of an LCD according to the present invention include a display panel 100, a chassis 200 and a backlight 300. The chassis 200 fixes the display panel 100 and is coupled with the display panel 100 so as to enclose edges of the display panel 100. Accordingly, the display panel 100 is divided into a non-exposed region shielded by the chassis 200 and not exposed to an outside, and an exposed region exposed to an outside.

Pixels are formed in the exposed region to display image information, and the first TFT 'T1' for operating each pixel is also formed in each pixel. A circuit for controlling the respective pixels is formed in the non-exposed region. The second TFT 'T2' serving as a light sensor for sensing light incident from outside the display may also be formed in the non-exposed region. The second TFT 'T2' has the openings formed in the gate electrode as shown in FIGS. 2A and 2B (for example). Then, if the second TFT 'T2' is disposed in the non-exposed region shielded by the chassis 200, the chassis 200 includes a light-transmitting part.

As shown in FIG. 5, the light-transmitting part may be a perforation hole 210 perforating the chassis 200. The perforation hole 210 and the second TFT 'T2' should be formed at an overlapping portion. Although FIG. 5 shows an embodiment with a single perforation hole 210 and a single second TFT 'T2', there may be multiple perforation holes and/or multiple second TFTs 'T2'. For example, perforation holes 210, may be formed at each of the four corners of the rectangular chassis 200 and four second TFTs 'T2' installed at the four corners, so that it is possible to sense the amount of light incident through the entire area of the screen.

The backlight 300 is disposed at a backside of the display panel 100. The backlight 300 is provided with one or more light sources 310 to generate light and irradiate the generated light toward the display panel 100. In the case of a large-sized LCD, a lamp can be used as the light source 310, whereas in the case of a small-sized LCD, light emitting diodes can be used. Although not shown in the drawings, the backlight may include a light guide plate, a light reflection plate and the like to guide the generated light. An adhesive part 110 is formed in the display panel 100. Although the adhesive part 110 appears to be disposed on the top edges of the display panel 100 in FIG. 5 so as to show a region occupied by the adhesive part 110, it is actually disposed on the bottom edges of the display panel 110. The backlight 300 is coupled with the display panel by the adhesive part 110. The adhesive part 110 can be made using a black tape that absorbs light irradiated from the backlight 300.

As shown in FIG. 5, the second TFT 'T2' is installed on a region where the adhesive part 110 of the display panel 100 is formed. By positioning TFT 'T2" as shown, the light irradiated from the backlight 300 does not reach the second TFT 'T2'. Leakage current generated in the second TFT 'T2' by the light of the backlight 300 is noise for the purpose of adjusting the brightness of the screen. Accordingly, as shown in FIG. 5, it is preferable that sources that may generate noise generation by the second TFT 'T2', such as light from the backlight 300, be shielded.

As described above, according to embodiments of the present invention, when a TFT is used as a light sensor, the gate electrode of the TFT is formed with an opening such that light can be incident into the opening, thereby enhancing the light sensing ability. Also, by using such a TFT in a substrate of a flat display or an LCD, it is possible to properly adjust the brightness of the screen according to the illumination from outside the display. Further, since the TFT is used as a light sensor, TFTs for operating respective pixels can be formed at the same time as the TFT for the light sensor in fabricating the above substrate.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A TFT comprising:
a source region and a drain region formed spaced apart from each other in a semiconductor layer;
a gate insulating film covering the semiconductor layer; and
a gate electrode formed on the gate insulating film and having at least one opening to expose a channel region between the source region and the drain region,
wherein the gate electrode defines the opening formed therethrough and is formed in a closed loop shape to surround the opening in a plan view,
wherein the source region includes a first concentration of impurities of a first impurity type,
wherein the semiconductor layer comprises a lightly doped region including a second concentration of impurities of the first impurity type,
wherein the second concentration is lower than the first concentration,
wherein the lightly doped region includes a first portion formed adjacent to the source region and a second portion formed adjacent to the drain region, and
wherein the gate electrode partially covers at least one of the first portion and the second portion in a plan view.

2. The TFT of claim 1, wherein the semiconductor layer includes polysilicon.

3. The TFT of claim 1, wherein the opening is formed to penetrate through the gate electrode such that the gate electrode has a plurality of inner walls defining the opening, and the plurality of inner walls have a closed loop shape in a plan view.

4. A TFT substrate comprising:
a plurality of data lines and gate lines crossing each other and defining pixel regions;
a plurality of first TFTs, wherein each of the pixel regions includes a first TFT; and
a second TFT positioned in a region other than the pixel regions, the second TFT including a source region and a drain region,
wherein the second TFT has a gate electrode having at least one opening,
wherein the at least one opening is positioned to expose one or more regions between the source region of the second TFT and the drain region of the second TFT, and
wherein the gate electrode defines the opening formed therethrough and is formed in a closed loop shape to surround the opening in a plan view,
wherein the source region includes a first concentration of impurities of a first impurity type,
wherein the semiconductor layer comprises a lightly doped region including a second concentration of impurities of the first impurity type,
wherein the second concentration is lower than the first concentration,
wherein the lightly doped region includes a first portion formed adjacent to the source region and a second portion formed adjacent to the drain region, and
wherein the gate electrode partially covers at least one of the first portion and the second portion in a plan view.

5. The TFT substrate of claim 4, wherein the second TFT is positioned in an edge region of the TFT substrate.

6. The TFT substrate of claim 4, wherein each of the first TFTs comprises a semiconductor layer including a source region and a drain region, and wherein the semiconductor layer comprises polysilicon.

7. The TFT substrate of claim 4, wherein the opening is formed to penetrate through the gate electrode such that the gate electrode has a plurality of inner walls defining the opening, and the plurality of inner walls have a closed loop shape in a plan view.

* * * * *